United States Patent [19]

Takagi et al.

[11] 4,443,650
[45] Apr. 17, 1984

[54] THERMOELECTRIC CONVERTER ELEMENT

[75] Inventors: Toshinori Takagi, Nagaokakyo; Kakuei Matsubara, Hirakata, both of Japan

[73] Assignee: Kyoto University, Kyoto, Japan

[21] Appl. No.: 369,116

[22] Filed: Apr. 16, 1982

[30] Foreign Application Priority Data

Apr. 17, 1981 [JP] Japan .................................. 56-56993

[51] Int. Cl.³ ............................................ H01L 35/28
[52] U.S. Cl. ..................................... 136/211; 29/573; 136/201; 136/225; 310/306; 322/2 R
[58] Field of Search ....................... 62/3, 148; 29/573; 136/203, 204, 206, 201, 211, 225; 310/306; 322/2 R

[56] References Cited

U.S. PATENT DOCUMENTS

| | | | |
|---|---|---|---|
| 3,648,470 | 3/1972 | Schultz | 136/203 X |
| 4,047,144 | 9/1977 | Wong | 338/2 |
| 4,054,478 | 10/1977 | Linnon | 29/573 X |
| 4,136,435 | 1/1979 | Li | 148/1.5 X |
| 4,292,579 | 9/1981 | Constant | 136/203 X |

Primary Examiner—Leland A. Sebastian
Attorney, Agent, or Firm—Fleit, Jacobson, Cohn & Price

[57] ABSTRACT

The disclosed thermoelectric converter element includes at least one member made of thermoelectric substance whose crystal structure is so controlled that its crystallographic axis is directed to a preferred orientation which is different from the direction of a thermoelectric current therethrough.

20 Claims, 6 Drawing Figures

FIG._4A
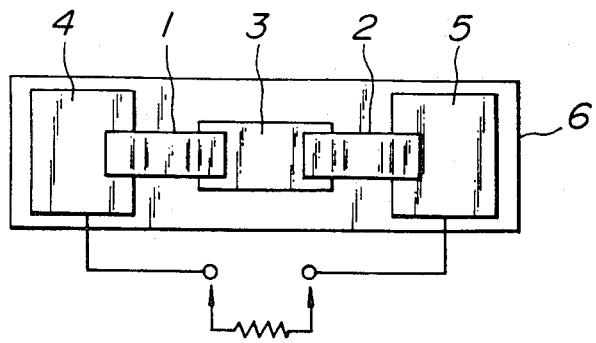
FIG._4B
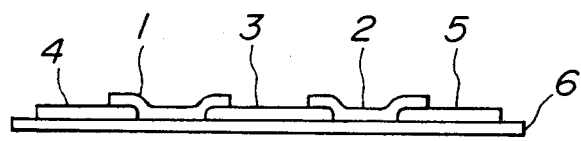
FIG._5
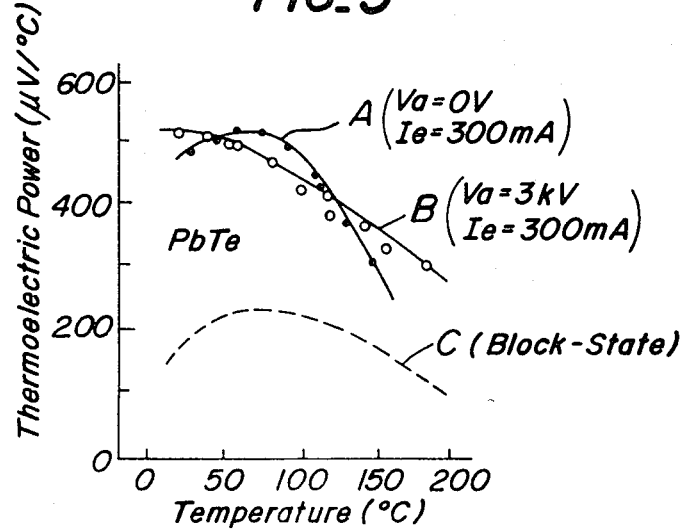

THERMOELECTRIC CONVERTER ELEMENT

BACKGROUND OF THE INVENTION

1. Field of the Invention

This invention relates to a thermoelectric converter element consisting of substance capable of thermoelectric conversion (to be referred to as "thermoelectric substance" hereinafter) which produces an electromotive force across opposite ends thereof upon application of a temperature difference across said opposite ends. More particularly, the invention improves the performance of the thermoelectric converter element of the above-mentioned type by controlling the crystal structure thereof.

2. Description of the Prior Art

An example of thermoelectric converter elements is the so-called thermo-couple consisting of a pair of metallic members of different kinds which are joined at one ends thereof, so that an electromotive force is generated across the joined ends of the metallic members and the opposite ends thereof upon application of a temperature difference across said joined ends and said opposite ends. A thermoelectric converter element made of semiconductor materials and having a similar structure as that of the conventional thermo-couple is also known. For instance, a semiconductor thermoelectric converter element using the Seebeck effect is formed by connecting one end of a p-type semiconductor member of bar shape to one end of a similarly shaped n-type semiconductor member through a metallic plate and connecting separate electrode plates to the opposite ends of the two semiconductor members as output terminals of the converter element. The joined ends of the two semiconductor members may be kept at a high temperature Th together with the metallic plate, while the opposite ends thereof may be kept at a low temperature Tc together with the electrode plates, so that a temperature difference is applied across the opposite ends of the p-type and n-type semiconductor members. Whereby, a positive potential $V_+$ may be produced at the open end of the p-type semiconductor member, while a negative potential $V_-$ may be produced at the open end of the n-type semiconductor member. The phenomenon of producing an electromotive force across the joined ends of two semiconductor members of different kinds and the opposite ends thereof is well known as the Seebeck effect and widely used in the thermoelectric converter elements for converting thermal energy into electric energy.

In the thermoelectric converter elements of the above-mentioned type, the p-type and n-type semiconductor members of bar shape are made of substance with block-state structure (to be referred to as block-state substance, hereinafter) formed by a melting method, Bridgman method, or a powder sintering method. The block-state substance made by such methods has polycrystal structure in the main, and it has been impossible to control the crystallographic axis thereof in a specific orientation at will with a high reproducibility. Accordingly, it has been impossible to evaluate the crystal structure of the thermoelectric substance in the case of the conventional thermoelectric converter elements made of semiconducting block-state substance and using the Seebeck effect. In fact, no attention has been paid to the crystal structure or crystallography of such semiconducting block-state substance.

On the other hand, from the standpoint of thermoelectric conversion efficiency of such thermoelectric converter elements, it is necessary to improve the performance index Z of the thermoelectric substance, which performance index Z is given by $$Z = \alpha^2 \sigma / \kappa$$

here,
- $\alpha$: thermoelectric power, namely, the rate of change of the induced voltage E with respect to the variation of temperature T, i.e., dE/dT,
- $\sigma$: electric conductivity, and
- $\kappa$: heat conductivity.

Thus, it is desirable to form a thermoelectric converter element by using a substance which has a large thermoelectric power $\alpha$, a large electric conductivity $\sigma$, and a small heat conductivity $\kappa$. However, in the conventional thermoelectric converter elements of the above-mentioned type, it has been impossible to arbitrarily control the crystal structure of the thermoelectric substance as pointed out above, so that it has been impossible to improve the above-mentioned performance index Z of such thermoelectric substance. In fact, no attention has been paid to the improvement from the standpoint of crystal structure. Thus, the prior art has a shortcoming in that major efforts for improving the performance of the thermoelectric substance have been only in the searching of substances with a large thermoelectric power $\alpha$ which is considered to be one of the inherent properties of specific substance.

Besides, the conventional thermoelectric converter elements have a shortcoming in that the thermoelectric substance made by the conventional methods are always in the block state, so that it has been very difficult to make such thermoelectric substance in miniature size or thin film, and it has been impossible to form the thermoelectric substance into integrated circuits with a high output voltage and a large output current.

SUMMARY OF THE INVENTION

Therefore, an object of the present invention is to obviate the above-mentioned shortcomings of the prior art, by providing an improved thermoelectric converter element. According to the present invention, the performance index of the thermoelectric substance is improved so as to facilitate thermoelectric conversion at a high efficiency and to facilitate miniaturization and formation of thin films suitable for integrated circuits.

To fulfil the object, in the thermoelectric converter element of the invention, the crystal structure of the substance capable of the thermoelectric conversion is so controlled that the crystallographic axis of the substance is substantially aligned with a preferred orientation which is different from the direction of electric current caused to flow therethrough by said thermoelectric conversion.

In a preferred embodiment of the invention, films of two kinds of thermoelectric substance are formed on a substrate in such a manner that the crystallographic axes of the thermoelectric substances are substantially aligned with a preferred orientation perpendicular to the plane of said substrate. One ends of the films are connected to each other or short circuited to each other, while the opposite ends thereof are connected to output electrode layers to form free ends, which electrode layers are deposited on the substrate. The two kinds of films may be in the form of p-type and n-type semiconductor films. The above-mentioned one ends of the films may be connected to each other through a metallic layer, so as to short-circuit them. Instead, the above-mentioned one ends of the films may be directly connected to each other by being overlaid one above the other. The substrate may be made of flexible insulating material. A plurality of the thermoelectric converter elements may be combined in an integrated form.

BRIEF DESCRIPTION OF THE DRAWINGS

For a better understanding of the invention, reference is made to the accompanying drawings, in which:

FIG. 4A and FIG. 4B are a top view and a side view of a thermoelectric converter element according to the present invention; and FIG. 5 is a graph showing the variation of the thermoelectric power with temperature change for the thermoelectric substance to be used in the present invention, as compared with similar variation of the conventional thermoelectric substance.

Throughout different views of the drawings, 1 is a p-type semiconductor member, 2 is an n-type semiconductor member, 3 is a metallic plate, 4 and 5 are electrode plates, and 6 is an insulating substrate.

DESCRIPTION OF THE PREFERRED EMBODIMENTS

Figure 1:
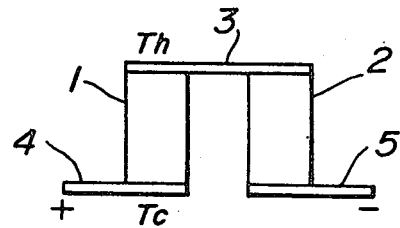
FIG. 1 is a schematic side view of a thermoelectric converter element of the prior art.

Before entering the details of the present invention, the prior art will be briefly reviewed by referring to FIG. 1. The thermoelectric converter element of FIG. 1 has a p-type semiconductor member 1 of bar shape and an n-type semiconductor member 2 of similar bar shape, and one ends of the semiconducor members 1 and 2 are joined together by a metallic plate 3. Opposite ends of the semiconductor members 1 and 2 are connected to electrode plates 4 and 5 acting as output terminals of the thermoelectric converter elements. When the above-mentioned one ends of the members 1 and 2 are kept at a high temperature Th together with the metallic plate 3, while the other ends of the two members 1 and 2 are kept a low temperature Tc together with the electrodes 4 and 5, a positive potential $V_+$ is produced at the electrode plate 4 of the p-type semiconductor member 1 and a negative potential $V_-$ is produced at the electrode plate 5 of the n-type semiconductor member 2. Such thermoelectric converter of the prior art has the shortcomings of hardly improvable performance index Z and difficulty in combining the converter elements in an integrated form, as pointed out above.

As to the factors for improving the above-mentioned performance index Z, the thermoelectric power $\alpha$ included in the expression of the index Z is considered to be an inherent property of the thermoelectric substance as pointed out above, and the effect of the crystal structure on the thermoelectric power $\alpha$ is not known yet and cannot be foreseen. The electric conductivity $\sigma$ or the mobility of electron of the thermoelectric substance seems to be unaffected by the orientation of the crystallographic axis, because the wavelength of the electrons propagating through solid substance is far shorter than the wavelength of phonon or thermal oscillation of crystal lattice.

On the other hand, among the factors contributing to the above-mentioned performance index Z, the heat conductivity $\kappa$ depends greatly on the crystal structure or crystallography of the thermoelectric substance and shows a high value in the direction of a preferred orientation of crystallographic axis and a minimum value in a direction different from the preferred orientation. Although it is not the inventors who found the above-mentioned dependency of the heat conductivity $\kappa$ of the thermoelectric substance on the crystal structure thereof, the improvement of the heat conductivity $\kappa$ through control of the crystal structure has never been considered, because the conventional method of producing the thermoelectric substance can make only the block-state structure and cannot improve the crystal structure. Even if someone should have thought of improvement of the crystal structure of thermoelectric substance by an evaporating method capable of forming a thin film of such substance, the use of the conventionally known evaporating method alone cannot control the crystal structure of the thermoelectric substance to a sufficient extent for improving the heat conductivity $\kappa$. Accordingly, as far as the improvement of the performance index Z of the thermoelectric converter element through control of the crystal structure thereof is concerned, actual studies have never been conducted. Only the cluster ion-beam evaporating method invented by the present inventors can sufficiently control the crystal structure for improving the heat conductivity $\kappa$.

In view of the state of the prior art as mentioned above, the inventors noted the fact that the cluster ion-beam evaporating method invented by the inventors can arbitrarily control the crystal structure of the thermoelectric converter substance and the inventors carried out a series of studies on the relation between the crystal structure and the performance index Z with emphasis on the variation of the heat conductivity $\kappa$ with the change of the crystal structure. As a result, the inventors found that the performance of the thermoelectric converter elements, such as the converter element of FIG. 1 using the Seeback effect, can be actually improved to a great extent by controlling the crystal structure of the thermoelectric substance.

More particularly, according to the present invention, when major semiconductor branches of a thermoelectric converter element, such as the p-type and n-type semiconductor members 1 and 2 of FIG. 1 using the Seeback effect, are formed, the crystallographic axis of the thermoelectric substance of such branches is substantially aligned with a preferred orientation which is different from the direction of the electric current flowing therethrough due to the thermoelectric conversion, i.e., the direction of the electromotive force produced by the thermoelectric conversion, so as to provide a high heat conductivity $\kappa$ in the direction of the preferred orientation, whereby a minimum heat conductivity $\kappa$ is provided in the desired direction of the electric current. Accordingly, as compared with the block-state substance of the prior art, the thermoelectric substance of the present invention has a greatly reduced value of the heat conductivity $\kappa$ in the direction of the thermoelectic conversion. Since the heat conductivity $\kappa$ is in the denominator of the expression of the performance index Z of the thermoelectric substance, i.e., $Z=\alpha^2\sigma/\kappa$, the performance index Z is greatly increased as the heat conductivity $\kappa$ is reduced. Besides, it is possible to shorten the required length of the semiconductor members 1 and 2, in terms of the distance between the end connected to the metallic plate 3 for exposure to the high temperature Th and the opposite end connected to the electrode plate 4 or 5 for exposure to the low temperature Tc, as the value of the heat conductivity $\kappa$ of the semiconductor in the direction of said length is reduced. Consequently, the size of the thermoelectric converter element can be reduced. Furthermore, a large temperature difference can be applied across the opposite ends of the semiconductor members 1 and 2, so as to operate the thermoelectric converter element at a high efficiency.

As regards the manufacturing method capable of controlling the crystal structure of the thermoelectric substance which is the essence of the present invention, film forming techniques based on ions are effective and preferable. More particularly, examples of the preferred effective methods are the ion plating method, ion-beam evaporating method, or cluster ion-beam evaporating method; wherein, a part or most part of the material being evaporated is ionized, so that the crystal structure of said material in a film formed by said evaporation can be controlled by accelerating or decelerating the velocity of the substance being evaporated so as to increase or decrease both the kinetic energy of the substance being deposited and the ratio of the ionized particles of the substance being evaporated to the total substance evaporated. An example based on the cluster ion-beam evaporation method will be described in detail, which method provides for easy control of the desired crystal structure at will.

As disclosed in Japanese Patent Laying-open Specification No. 33,890/74 under the title of "Method and Apparatus for Depositing a Thin Film", the cluster ion-beam evaporating method invented by one of the inventors thereof is a method of depositing a thin film on a substrate, wherein a vapor-generating furnace, an ion-extracting electrode having a built-in electron-emitting source, and a substrate for providing the thin film thereon are arranged in a high-vacuum chamber, and an accelerating voltage is applied across the vapor-generating furnace and the ion-extracting electrode so that the former becomes positive and the latter becomes negative. The substance to be vapor-deposited in the vapor-generating furnace is then evaporated by heating wherein the vapor pressure of the substance to be vapor-deposited and high-vacuum chamber pressure are maintained with a pressure difference of at least 10 times therebetween. The vapor is injected in the high vacuum chamber through a small hole bored on the furnace wall so as to generate aggregations (clusters) of atoms by a supercooling phenomenon under adiabatic expansion. The clusters of atoms are radiated by an electron beam emanating from the radiation source built in the ion-extracting electrode to generate cluster ions, and the cluster ions are accelerated to provide the thin film on the substrate. More particularly, the substance to be evaporated is placed in a crucible and the crucible is sealed and heated so as to produce a high-pressure vapour of the substance being evaporated, and the high-pressure vapour is injected into a high-vacuum space through a nozzle provided on the wall of the crucible, so that the injected vapour is frozen by the super cooling phenomenon due to the adiabatic expansion at the time of injection, whereby 500 to 2,000 atoms of the substance being evaporated are loosely coupled to each other to form a cluster. A plurality of such clusters produces a stream of the substance being evaporated, and an electron shower of a suitable electric current value is applied to the stream of the substance being evaporated during the flight from the nozzle to the substrate. Whereby, the clusters in the stream of the substance being evaporated are ionized at a suitable rate in such a manner that, in each of the ionized clusters, only one atom out of the 500 to 2,000 atoms therein is ionized. Thus, the stream of the substance being evaporated is ionized with a very small charge-to-mass ratio (e/m). If necessary, an accelerating voltage $V_a$ is applied to the stream of the substance being evaporated, and the magnitude of the accelerating voltage $V_a$ is regulated. Accordingly, the striking velocity of the stream of the substance being evaporated relative to the substance is made controllable over a very wide range. The stream of the substance being evaporated with the controlled velocity collides with the substrate and form an evaporated film thereon. It is noted that the non-ionized clusters are not accelerated by the application of the accelerating voltage $V_a$ and collide with the substrate with a kinetic energy corresponding to the injecting speed obtained at the injection through the nozzle. Thus, both the non-accelerated clusters and the ionized and accelerated clusters contribute to the formation of the desired evaporated film. Above all, the crystal structure of the film substance thus evaporated can be arbitrarily controlled by regulating the electron current $I_e$ of the electron shower and the accelerating voltage $V_a$.

An advantage of the cluster ion-beam evaporating method is in that a large amount of the substance being evaporated can be transmitted at a low acceleration without any disturbance from space charge generated at the time of deposition onto the insulating substrate, because the charge-to-mass ratio (e/m) of the stream of the substance being evaporated is less than one-thousandth (1/1,000) of that in the case of a single atomic ion. As a result, a high evaporating speed is achieved, and the migration effect inherent to the striking at the substrate, i.e., the diffusion effect on the substrate surface, is additionally caused, so that an evaporated film of very high quality can be formed. Accordingly, the formation of a high-performance film and the control of the crystal structure of the evaporated film are made easy, which formation and control have been very difficult to realize by the conventional film forming methods under the so-called thermal equilibrium by using the thermal or chemical energy.

Figure 3:
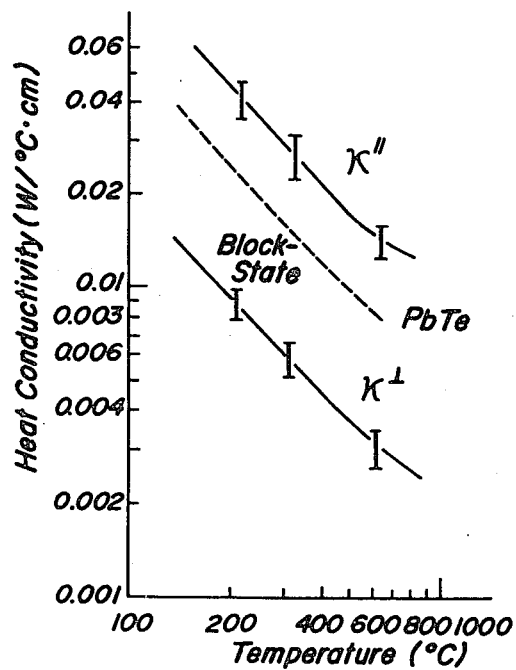
FIG. 3 is a graph showing the variation of the heat conductivity of the thermoelectric substance of FIG. 2 with temperature change, as compared with similar variation of the conventional thermoelectric substance.
Figure 2:
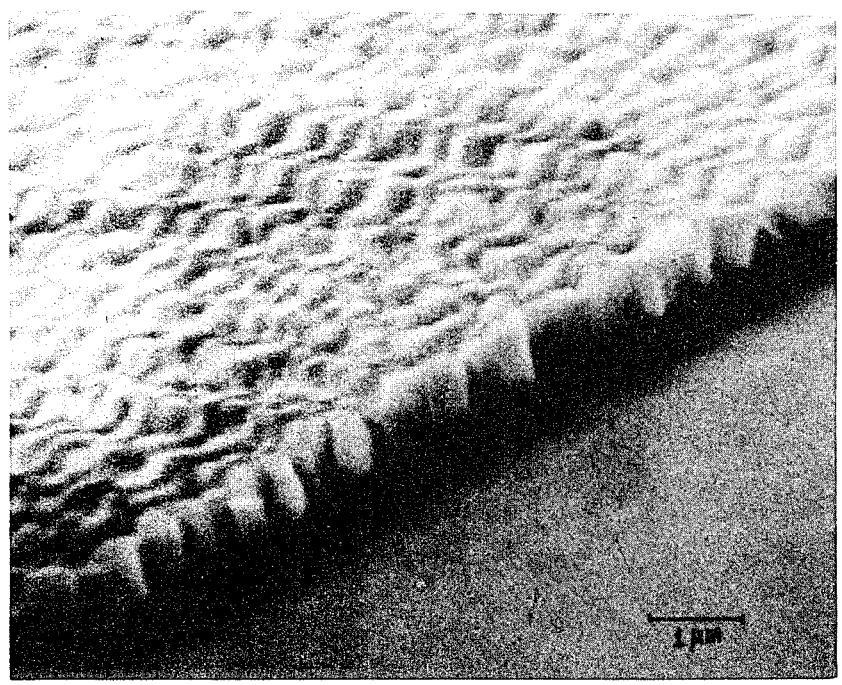
FIG. 2 is a microscopic photograph of an example of evaporated thermoelectric substance which is used in a thermoelectric converter element of the present invention.

FIG. 2 shows an electron microscope photograph of a film of lead telluride (PbTe) deposited on a substrate by the above-mentioned cluster ion-beam evaporating method, as an example of the thermoelectric substance suitable for the thermoelectric converter element of the present invention. The lead telluride (PbTe) film of FIG. 2 was formed on an amorphous substrate, such as a glass substrate, by the cluster ion-beam evaporating method under the conditions of an electron current $I_e=300$ mA for the ionizing electron shower, an accelerating voltage $V_a=3$ kV, a substrate temperature $T_s=200°$ C., and a vacuum of $5\times10^{-16}$ Torr in the evaporating vacuum space. As apparent from the electron microscope photograph of FIG. 2, the preferred orientation for the crystallographic axis <200> of the film deposited on the substrate by evaporation is perpendicular to the plane of the substrate. The variations of the heat conductivity κ with the change of the temperature of the semiconductor members of FIG. 1 and the deposited film of FIG. 2 were measured, and the result is shown in FIG. 3. In the figure, $\kappa^\perp$ stands for the heat conductivity of the deposited film in the direction perpendicular to the preferred orientation of the crystallograph axis thereof, that is the direction parallel to the surface of the substrate, while $\kappa\|$ stands for the heat conductivity of the deposited film in the direction parallel to the preferred orientation of the crystallographic axis thereof, that is the direction perpendicular to the surface of the substrate. The dashed line in FIG. 3 represents the test result of the semiconductor members 1 and 2 of FIG. 1. As can be seen from the graph of FIG. 3, the heat conductivity $\kappa^\perp$ in the direction parallel to the surface of the substrate is reduced to about one-fifth (1/5) of the heat conductivity $\kappa\|$ in the direction perpendicular to the surface of the substrate and to about one-fourth (¼) of that of the conventional semiconducting block-state substance. Accordingly, the crystal structure of the thermoelectric sustance is controlled in such a manner that the heat conductivity κ in the direction of the flow of an electric current produced by the thermoelectric conversion is made very small as compared with both that in the direction of the preferred orientation of the crystallographic axis and that of the conventional polycrystal semiconducting block-state substance. Thus, it has been proved that the performance index of the thermoelectric substance can be actually improved to a great extent by controlling the crystal structure.

Accordingly, referring to the film of the thermoelectric substance deposited on the substrate as shown in FIG. 2, if films of p-type and n-type semiconducting thermoelectric substances are deposited on a substrate in such a manner that the crystallographic axes of such film substances are substantially aligned with the preferred orientation which is perpendicuar to the plane of the substrate and the direction of the flow of electric current produced by the thermoelectric conversion is parallel to the plane of the substrate or perpendicular to the preferred orientation of the crystallographic axes, the thermoelectric conversion efficiency of a thermoelectric converter element using the p-type and n-type semiconductor films thus deposited is greatly improved as compared with that of the conventional elements such as that shown in FIG. 1. Besides, the p-type and n-type semiconductor films can be very thin, so that thermoelectric converter elements can be manufactured in the form of thin films and integrated circuits.

FIG. 4A and FIG. 4B show a top view and a side view of an embodiment of the thermoelectric converter element according to the present invention. In the illustrated embodiment, a metallic plate 3 to form a high temperature zone is bonded to an insulating substrate 6 by means of a conventional metallic film forming method or a metal piece bonding method. Converter output electrode plates 4 and 5 to form low temperature zones are bonded to the substrate 6 on the opposite sides of the metallic plate 3 with substantially the same spacings of suitable magnitude from the metallic plate 3 by means of a method similar to that for the metallic plate 3. A thermoelectric semiconductor film, such as a p-type lead telluride (PbTe) film 1, is formed between the metallic plate 3 and the low temperature zone electrode plate 4 on the substrate 6, while another thermoelectric semiconductor film, such as an n-type lead telluride (PbTe) film 2, is formed between the metallic plate 3 and the other low temperature zone electrode plate 5 on the substrate 6. The semiconductor films 1 and 2 are formed on the substrate 6 by a suitable ionized evaporating method for producing a deposited film, such as the above-mentioned cluster ion-beam evaporating method, in such a manner that the semiconductor film 1 bridges the metallic plate 3 to the electrode plate 4 while the semiconductor film 2 bridges the metallic plate 3 to the other electrode plate 5. To test the thermoelectric converter element of the invention having the illustrated construction, the high temperature zone including the metallic plate 3 was kept at a high temperature Th=100° C., while the low temperature zones including the electrode plates 4 and 5 were kept at a low temperature Tc=10° C., and a thermoelectric power α=450 μV/°C. was obtained and an electromotive force of about 0.1 V was produced across the converter output electrode plates 4 and 5.

Detailed tests on the temperature characteristics of the thermoelectric power α of the thermoelectric converter element of the present invention were carried out, and the result is shown in FIG. 5. In FIG. 5, the curve A represents the temperature characteristics of the thermoelectric power α in the case that the semiconductor films 1 and 2 were deposited by the above-mentioned cluster ion-beam evaporating method while applying both an electron shower with an electron current $I_e = 300$ mA and an accelerating voltage $V_a = 0$ V to an injected cluster stream of high-pressure lead telluride (PbTe) vapour, while the curve B represents similar characteristics under similar depositing conditions except that the accelerating voltage $V_a$ was not zero but $V_a = 3$ kV. The curve C of FIG. 5 represents the temperature characteristics of the thermoelectric power α of the conventional thermoelectric converter element of FIG. 1 having semiconductor members of bar shape consisting of lead telluride (PbTe) of block-state. As can be seen from FIG. 5, the magnitude of the thermoelectric power α of the curves A and B in the case of using the lead telluride (PbTe) thin films formed by the ionized evaporating method is about 3 times the thermolectic power α of the curve C in the case of using the conventional block-state lead telluride (PbTe) bar members. Although the thermoelectric power α has been considered to be inherent to specific thermoelectric substance in the past, the inventors have proved that the thermoelectric power α can be considerably improved by controlling the crystal structure of the thermoelectric substance through ionized evaporating method as compared with that of the prior art, so that the performance index Z of such substance can be also improved thereby. The reason why such a large thermoelectric power α is achieved by the cluster ion-beam evaporating method seems to be in that the cluster ion-beam evarporating method uses reactions under thermal non-equilibrium state, so that the mechanism of the growth of crystal nuclei on the substrate and the mechanism of growth of the thin film thereon are essentially different from those of the prior art.

In the above-mentioned embodiment, the thin films of the thermoelectric substance were formed by using the cluster ion-beam evaporating method, but it is of course possible to use other ionized evaporating methods in order to form the desired films provided that similar effects and functions are ensured. As regards the substance capable of thermoelectric conversion, only lead telluride (PbTe) has been quoted in the foregoing, but the above-mentioned functions and effects of the present invention can be achieved in any thermoelectric substances as far as theory is concerned. Besides the quoted lead telluride (PbTe), other semiconducting substances which have been conventionally used as thermoelectric substances, such as bismuth telluride ($Bi_2Te_3$), germanium (Ge), silicon (Si), indium arsenide (InAs), indium antimonide (InSb), gallium antimonide (GaSb), gallium arsenide (GaAs), indium phosphide (InP), and the like can be used in the present invention to produce excellent thermoelectric converter elements. As regards the mechanical formation of the thermoelectric converter elements, the embodiment of FIG. 4 uses a metallic plate 3 to connect the p-type and n-type semiconductor members 1 and 2 as in the case of the conventional thermoelectric converter element of FIG. 1. However, the invention is not restricted by such metallic plate, and when a suitable bondage is available, small portions of the p-type and n-type semiconductor thin films 1 and 2 of FIG. 4 can be, for instance, overlaid one above the other in the course of depositing such thin films. In fact, numerous changes are possible to meet various requirements of specific applications such as production of integrated circuits.

More particularly, thermoelectric converter devices with desired ratings of voltage and current can be easily produced by combining a number of the thermoelectric converter elements of the invention as component units, such as that of FIG. 4, in series or in parallel. For instance, such thermoelectric converter device can be integrated on one substrate. If the insulating substrate 6 is made of flexible insulating material such as Mylar (Trademark) or polyimide, a flexible thermoelectric converter element is provided so as to expand the application of such element. It is also easy to form the low temperature electrode plates 4 and 5 in a manner suitable for electrolysis, for instance by forming the portion of the metallic plate 3 of FIG. 4 in the shape of a saddle while forming the semiconductor thin film portions in an inverse U-shape so that the low temperature electrode plates 4 and 5 are dipped face-to-face in a liquid electrolyte acting also as a coolant. The thermoelectric converter elements of the invention with such formation can be used to convert solar energy into electric energy of low voltage and large current, so as to electrolytically generate hydrogen. Thus, the thermoelectric converter elements of the invention can be very easily applied to the conversion of natural energy for practical or commercial use.

As described in the foregoing, with the present invention, the heat conductivity of thermoelectric substance in the direction of electric current flowing therethrough can be reduced and the thermoelectric power of such substance can be increased, so that the performance index of the thermoelectric substance can be greatly increased as compared with that of the prior art while facilitating the miniaturization of the thermoelectric converter elements, whereby such elements can be formed in the shape of thin films or integrated circuits. For instance, the invention facilitates the production of the thermoelectric converter elements in any desired shape suitable for specific applications, such as various temperature sensors, electrolytic electrodes for utilizing natural energy, and the like.

Although the present invention has been described with a certain degree of particularity, it is understood that the present disclosure has been made only by way of example and that numerous changes in details of construction and the combination and arrangement of parts may be resorted to without departing from the scope of the invention as hereinafter claimed.

We claim:

1. A thermoelectric converter element, comprising at least one film made of a semiconductor produced by a film forming technique based on ions and capable of thermoelectric conversion, said semiconductor having a crystal structure such that a crystallographic axis thereof is substantially aligned with a preferred orientation which is substantially perpendicular to the direction of flow of an electric current produced by the thermoelectric conversion therein.

2. A thermoelectric converter element as set forth in claim 1, wherein said thermoelectric converter element comprises a pair of films made of said semiconductor and a substrate on which said pair of films are formed, each of said films is deposited on said subtrate while substantially aligning crystallographic axes thereof with a preferred orientation perpendicular to the plane of said substrate, and one ends of said pair of films are jointed to each other while opposite ends thereof are separately joined to converter output electrode layers deposited on said substrate.

3. A thermoelectric converter element as set forth in claim 2, wherein one of said pair of films is made of p-type semiconductor, while the other one of said pair of films is made of n-type semiconductor.

4. A thermoelectric converter element as set forth in claim 2 or 3, wherein said one ends of said pair of films are joined to each other through a metallic layer.

5. A thermoelectric converter element as set forth in claim 2 or 3, wherein said one ends of said pair of films are directly joined to each other by being partly overlaid one above the other.

6. A thermoelectric converter element as set forth in claim 2 or 3, wherein said substrate is made of flexible insulating material.

7. A thermoelectric converter elemment as set forth in claim 4, wherein said substrate is made of flexible insulating material.

8. A thermoelectric converter element as set forth in claim 5, wherein said substrate is made of flexible insulating material.

9. A thermoelectric converter device, comprising a plurality of thermoelectric converter elements combined in an integrated form; each of said elements having a substrate, a pair of films made of semiconductor produced by a film forming technique based on ions and capable of thermoelectric conversion, one of the ends of said films being joined to each other, a pair of separate converter output electrode layers deposited on said substrate, opposite ends of said films being separately connected to said converter output electrode layers, each of said films having a crystallographic axis thereof being substantially aligned with a preferred orientation perpendicular to the plane of the substrate.

10. A thermoelectric converter device as set forth in claim 9, wherein said one ends of said pair of films in each thermoelectric converter element are joined to each other through a metallic layer.

11. A thermoelectric converter device as set forth in claim 9, wherein said one ends of said pair of films in each thermoelectric converter element are directly joined to each other by being partly overlaid one above the other.

12. A thermoelectric converter device as set forth in claim 9, wherein said substrate of each thermoelectric converter element is made of flexible insulating material.

13. A thermoelectric converter device as set forth in claim 10, wherein said substrate of each thermoelectric converter element is made of flexible insulating material.

14. A thermoelectric converter device as set forth in claim 11, wherein said substrate of each thermoelectric converter element is made of flexible insulating material.

15. A thermoelectric converter device, comprising a plurality of thermoelectric converter elements combined in an integrated form, each of said elements having a substrate, a pair of films made of semiconductor produced by a film forming technique based on ions and capable of thermoelectric conversion, one of the ends of said films being joined to each other, a pair of separate converter output electrode layers being deposited on said substrate, opposite ends of said film being separately connected to said converter output electrode layers, each of said films having a crystallographic axis thereof being substantially aligned with a preferred orientation perpendicular to the plane of the substrate, one of each pair of films in each thermoelectric converter element being made of p-type semiconductor, while the other one of said pair of films being made of n-type semiconductor.

16. A thermoelectric converter device as set forth in claim 15, wherein the ends of said films in each thermoelectric converter element are directly joined with each other through a metallic layer.

17. A thermoelectric converter device as set forth in claim 15, wherein the ends of said films in each thermoelectric converter element are directly joined with each other by being partly overlaid one above the other.

18. A thermoelectric converter device as set forth in claim 15, wherein said substrate of each thermoelectric converter element is made of flexible insulating material.

19. A thermoelectric converter device as set forth in claim 16, wherein said substrate of each thermoelectric converter element is made of flexible insulating material.

20. A thermoelectric converter device as set forth in claim 18, wherein said substrate of each thermoelectric converter element is made of flexible insulating material.

* * * * *